United States Patent
Kitano et al.

[11] Patent Number: 6,122,177
[45] Date of Patent: Sep. 19, 2000

[54] SEMICONDUCTOR DEVICE-MOUNTED ON A PRINTED CIRCUIT BOARD HAVING SOLDER BUMPS WITH EXCELLENT CONNECTION RELIABILITY

[75] Inventors: Makoto Kitano, Tsuchiura; Michiharu Honda, Yokohama, both of Japan

[73] Assignee: Hitachi, Ltd., Tokyo, Japan

[21] Appl. No.: 09/048,856

[22] Filed: Mar. 27, 1998

[30] Foreign Application Priority Data

Mar. 31, 1997 [JP] Japan ................................ 9-079569

[51] Int. Cl.[7] .......................... H01L 21/58; G01R 31/27
[52] U.S. Cl. ...................... 361/783; 257/737; 257/738; 257/778; 228/180.22; 438/15; 438/615
[58] Field of Search ............................. 174/261, 260; 228/180.22, 180.21; 257/737, 738, 780, 778; 438/612, 613, 615, 15; 439/68, 69, 82, 83; 361/783

[56] References Cited

U.S. PATENT DOCUMENTS

| Re. 35,423 | 1/1997 | Adams et al. | 378/58 |
|---|---|---|---|
| 4,684,544 | 8/1987 | Arnett | 427/96 |
| 4,921,550 | 5/1990 | McLellan | 148/24 |
| 5,012,502 | 4/1991 | Battin et al. | 378/58 |
| 5,040,281 | 8/1991 | Sumiyoshi | 29/428 |
| 5,216,278 | 6/1993 | Lin et al. | 257/737 |
| 5,877,079 | 3/1999 | Karasawa et al. | 438/613 |
| 5,878,943 | 3/1999 | Nishikawa et al. | 228/180.22 |

FOREIGN PATENT DOCUMENTS

| 63-86456 | 4/1988 | Japan. |
|---|---|---|
| 6-504408 | 5/1994 | Japan. |
| 6-224259 | 8/1994 | Japan. |
| 6-302604 | 10/1994 | Japan. |

OTHER PUBLICATIONS

Nikkei Electronics, No. 601, pp. 59–73, Feb. 1994.

*Primary Examiner*—Jeffrey Gaffin
*Assistant Examiner*—John B. Vigushin
*Attorney, Agent, or Firm*—Antonelli, Terry, Stout & Kraus, LLP

[57] ABSTRACT

In order to reduce a strain, developing in solder bumps in a BGA-type semiconductor device-mounting construction, so as to enhance a thermal fatigue life, voids, present in each solder bump joint portion of a BGA-type semiconductor device, are limited to a predetermined size, and a void of a large size, which would increase a strain to be produced, is eliminated.

8 Claims, 3 Drawing Sheets

SEMICONDUCTOR DEVICE-MOUNTED ON A PRINTED CIRCUIT BOARD HAVING SOLDER BUMPS WITH EXCELLENT CONNECTION RELIABILITY

FIELD OF THE INVENTION

This invention relates to a semiconductor device-mounting construction having solder bumps serving as external terminals, and more particularly to a semiconductor device-mounting construction capable of achieving an excellent connection reliability of solder bumps. This invention also relates to a method of inspecting such a semiconductor device-mounting construction.

BACKGROUND OF THE INVENTION

With the highly-integrated design of semiconductor devices, there have now been developed semiconductor devices having an increased number of external terminals (pins). There have been used two methods of achieving such a semiconductor, and one is a method in which in a conventional quad flat package (hereinafter ref erred to as "QFP") having leads serving as external terminals, the pitch of the terminals is made finer or smaller, thereby increasing the number of pins.

According to this method, there has been developed a QFP of the type in which the terminal pitch is reduced to 0.3 mm. However, the terminals are arranged in a one-dimensional manner, and therefore it is said that the upper limit is 400 pins in view of the dimensions of the semiconductor device which can be mounted.

The other method is one in which solder bumps are arranged in a two-dimensional manner on a reverse surface of a semiconductor device, and are used as external terminals. A semiconductor device of this construction is commonly called a ball grid array (hereinafter referred to as "BGA"). The detailed construction of a BGA is disclosed, for example, U. S. Pat. No. 5,216,278 and NIKKEI ELECTRONICS No. 601, page 59.

Recently, there have been developed a BGA-type semiconductor device whose size is reduced to the size of a semiconductor chip. This is called a chip-size package (hereinafter referred to as "CSP"). The detailed construction of a CSP is disclosed in NIKKEI ELECTRONICS No. 668, page 139. Further, Japanese Patent Laid-Open Publication No. 6-504408 (WO92/05582) discloses a CSP of the type in which a tape, having external terminals, is provided on a circuit-forming surface of a semiconductor chip through a soft or elastic material (elastomer resin), and the external terminals are electrically connected to electrodes of the semiconductor chip. Japanese Patent Unexamined Publication No. 6-224259 discloses a construction in which a semiconductor chip is mounted on a ceramic substrate having through holes, and electrodes are formed on the opposite surface of the ceramic substrate, and the semiconductor device is mounted on a printed circuit board.

Japanese Patent Unexamined Publication No. 6-302604 discloses a CSP of the type in which a metallic wiring pattern is formed on a circuit-forming surface of a semiconductor chip, and external terminals are provided on this wiring pattern.

What becomes a large problem with the BGA-type semiconductor device, using the solder bumps as the external terminals, is the connection reliability of the solder bumps. If the coefficient of linear expansion of the semiconductor device is different from that of a mounting board, a strain develops in the solder joint portions in accordance with a temperature change, and when this is repeated, a thermal fatigue failure may occur. In the conventional semiconductor device, such as a QFP, having leads serving as external terminals, the leads absorb this thermal deformation, thereby reducing a strain developing in the solder, so that the thermal fatigue failure can be prevented. However, in the BGA-type semiconductor device, thermal deformation is applied directly to the solder bumps.

Therefore, in the type of BGA-type semiconductor device (as disclosed in U.S. Pat. No. 5,216,278) using a printed circuit board, there is employed a method in which the printed circuit board of the semiconductor device and a mounting printed circuit board are made equal in the coefficient of linear expansion to each other, thereby preventing thermal deformation. However, even if the two printed circuit boards are made of the same kind of material, the two boards are different in the coefficient of linear expansion from each other usually by an amount of about $2 \times 10^{-6}/°$ C. because of variations in the coefficient of linear expansion of the material.

Among the above-mentioned prior art devices, it is thought that the semiconductor device, disclosed in Japanese Patent Laid-Open Publication No. 6-504408, is the type in which the solder fatigue failure is most taken into consideration, and the reliability is the highest. In this semiconductor device, the tape, having the external terminals, is provided on the semiconductor chip through the elastomer resin, and the external terminals are electrically connected to the electrodes of the semiconductor chip, and the solder bumps are joined to the external terminals. Therefore, the thermal deformation due to the difference in the coefficient of linear expansion between the semiconductor chip and the mounting board can be absorbed by the elastomer, thereby preventing the thermal fatigue failure of the solder bumps. However, the size of this semiconductor device coincides with the size of the semiconductor chip, and therefore the number of pins is limited.

And besides, voids, which are due to insufficient wetting and the involvement of gas during joining of the solder, are present in the solder joint portion. From the study by the inventors of the present invention, it is clear that these voids are a factor reducing a fatigue life of the solder joint portion, and its contents are described in "Current Japanese Material Research, No. 2(1987), pp.235" published by the Society of Materials Science, Japan. With respect to this problem, the target of the process design is to reduce the ratio of the total area of voids to the total cross-sectional area of the joint portion (commonly referred to as "void ratio") Namely, efforts have been made to reduce the total area of the voids.

As described above, the conventional BGA-type semiconductor devices still have the problem with respect to the connection reliability of the solder bumps regardless of their construction. Particularly, no consideration has been given to a reduced thermal fatigue life due to the influence of the voids existing in the solder bump joint portion.

SUMMARY OF THE INVENTION

It is an object of this invention to provide a BGA-type semiconductor device which overcomes the drawbacks of the above conventional BGA-type semiconductor devices, and achieves an excellent connection reliability of solder bumps. The above object has been achieved by limiting voids, present in a solder joint portion of a BGA-type semiconductor device, to a predetermined size.

A semiconductor device-mounting construction of the present invention comprises a semiconductor device having a plurality of electrodes formed on one main surface thereof, a printed circuit board having a wiring pattern formed on one main surface thereof, and a plurality of solder bumps interposed between the plurality of electrodes and the wiring pattern to electrically connect the semiconductor device and the printed circuit board together, and this semiconductor device-mounting construction has the following features:

(1) All of voids, which are present in an interface of each of those of the plurality of solder bumps (which are disposed closest to an outer peripheral edge of the semiconductor device), joined to the semiconductor device, are fine, and generally uniform in size.

A shearing strain, developing in the solder bump, becomes larger as the distance between the solder bump and the center of the semiconductor device becomes larger, and therefore those solder bumps, disposed closest to an outer periphery edge of the semiconductor device, are subjected to a severest condition. Therefore, if all of the voids, which are present in the interface of the solder bump under this severest condition, are fine, and generally uniform in size (that is, uniform voids), the concentration of the strain will not occur, so that the reliability of the solder bump joint portion is enhanced.

The term "uniform voids", which are fine and generally uniform in size, does not mean that these voids are exactly uniform or equal in size, but variations in void size are allowed. In an ordinary solder joint formed in the atmosphere, a variation of two times void size is allowable.

(2) The diameter of all of the voids, which are present in the interface of each of those of the plurality of solder bumps (which are disposed closest to the outer peripheral edge of the semiconductor device), joined to the semiconductor device, is not more than $\frac{1}{10}$ of the diameter of the interface.

If the diameter of the voids, present in the interface of the solder bump under the severest condition, is not more than $\frac{1}{10}$ of the diameter of the interface, the concentration of the strain in the voids will not occur, so that the reliability of the solder bump joint portion is enhanced.

The interface, as well as the voids, are generally circular in shape, but strictly, if equivalent diameters [the equivalent diameter of the interface=$\sqrt{(4 \times a \text{ cross-sectional area of the interface}/\pi)}$, the equivalent diameter of the void =$\sqrt{(4 \times a \text{ cross-sectional area of the void}/\pi)}$] are used respectively as the diameter of the interface and the diameter of the void, the present invention can be applied.

(3) In the semiconductor device-mounting construction according to Paragraph (1) or Paragraph (2), a length of one side of the semiconductor device is not less than 30 mm.

In the semiconductor device whose one side is more than 30 mm, no margin is left for the fatigue strength of the ordinary reliability standard, and it is necessary that the semiconductor device-mounting construction of Paragraph (1) or Paragraph (2) should be used.

(4) In the semiconductor device-mounting construction according to any one of Paragraphs (1), (2) and (3), the number of the electrodes of the semiconductor device is not less than 441.

In the semiconductor device in which the number of electrodes is not less than 441, no margin is left for the fatigue strength of the ordinary reliability standard, and it is necessary that the semiconductor device-mounting construction of any of Paragraphs (1) to (3) should be used.

A method of the present invention for inspecting a connection reliability of solder bumps in a semiconductor device-mounting construction (comprising a semiconductor device having a plurality of electrodes formed on one main surface thereof, a printed circuit board having a wiring pattern formed on one main surface thereof, and a plurality of solder bumps interposed between the plurality of electrodes and the wiring pattern to electrically connect the semiconductor device and the printed circuit board together) has the following features:

(5) When a diameter of the largest one of voids, which are present in an interface of each of the solder bumps joined to the semiconductor device, exceeds a predetermined value, the semiconductor device-mounting construction is decided as a rejected one.

(6) In the method according to Paragraph (5), the predetermined value is not more than $\frac{1}{10}$ of the diameter of the interface.

A strain, developing in the solder, is determined by the size of a concentration void rather than by the ratio of the void area. Therefore, it is only necessary to inspect the largest void at the interface between the solder bump and the semiconductor device. Specifically, a sampling destructive test or a x-ray fluoroscopic test is effected, and when the value of the largest void exceeds a predetermined value, the semiconductor device-mounting construction is decided as a rejected one.

DESCRIPTION OF THE PREFERRED EMBODIMENTS

A preferred embodiment of the present invention will now be described in detail with reference to the drawings.

First, description will be made based on the analysis and tests conducted by the inventors of the present invention with respect to a mechanism of production of voids in a solder bump connection portion.

Figure 3:
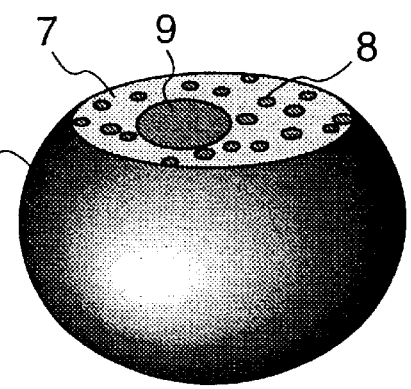
FIG. 3 an enlarged, perspective view showing a joint interface of a solder bump used in a conventional BGA-type semiconductor device-mounting construction.

FIG. 3 shows an interface 7 of a conventional solder bump 1 joined to a BGA-type semiconductor device (not shown). This Figure shows the surface from which the BGA-type semiconductor device was peeled after a force was applied to the solder bumps. Voids are inevitably present in the interface 7, and these voids are classified into uniform-size voids 8 (majority) (hereinafter referred to as "uniform voids") and a single void 9 (hereinafter referred to as "concentration void") having a larger size. A study by the inventors of the present invention has made the mechanism of production of these voids clear as follows.

Figure 4A:
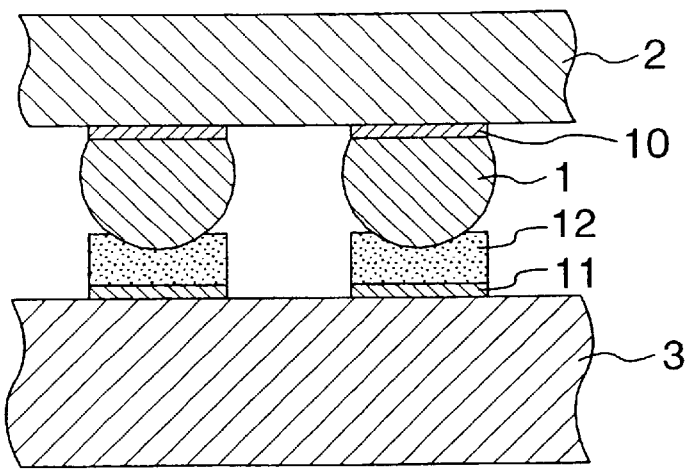
FIGS. 4A to 4C are cross-sectional view showing a mechanism of formation of a concentration void.
Figure 4B:
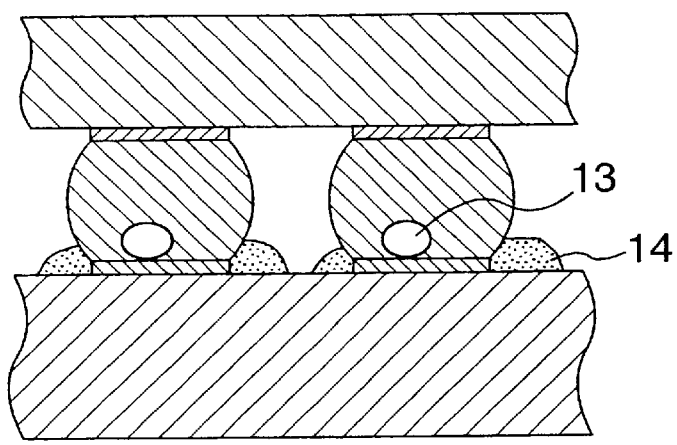
Figure 4C:
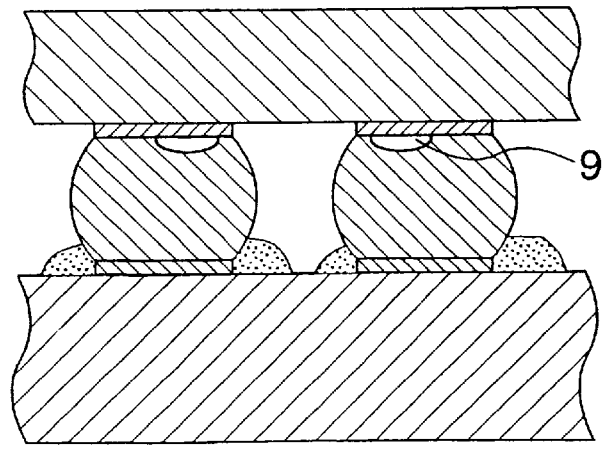

The mechanism of production of the concentration void 9 will first be described with reference to FIGS. 4A to 4C. FIGS. 4A to 4C show a process of mounting the BGA-type semiconductor device by a reflow soldering method. FIG. 4A shows a condition in which the semiconductor device is placed on a mounting board 3, and solder paste 12 is printed on a wiring pattern 11 formed on the mounting board 3, and solder bumps 1, joined to BGA electrodes 10 on a BGA board 2, are placed on the solder paste 12. The solder paste 12 is formed by kneading fine grains of solder, using a flux, and this flux functions to chemically melt an oxide film, formed on the metal (here, the wiring pattern 11) to be soldered, thereby exposing the surface of the metal. FIG. 4B shows a condition in which the solder bumps are heated to a temperature above a melting point of the solder. Each of the molten solder bumps 1 wets the wiring pattern 11, and the flux 14 in the solder paste 12 flows aside. At this time, part of the flux is vaporized, and is dissipated to the atmosphere, and part of this vapor remains as a bubble 13 in the solder bump 1. This bubble moves toward the BGA board 2 because of buoyancy. FIG. 4C shows a condition after a cooling operation is effected. The bubble 13 remains as the concentration void 9 in the joint interface of the solder bump 1 at which the solder bump 1 is joined to the BGA board 2.

Next, referring to the uniform voids, these uniform voids are formed by a joint defect due to the insufficient wetting between the solder bump 1 and the BGA electrode 10. In an ordinary soldering method which is effected in the atmosphere, it is difficult to perfectly remove such fine voids.

In order to determine what influence these voids give to the joint reliability of the solder bumps, the inventors of the present invention have made a study, using finite element analysis. Two kinds of analysis models were prepared. One corresponds to a concentration void, and a single void was formed in a solder bump, and a relative displacement due to the difference in the coefficient of linear expansion between a BGA semiconductor board and a mounting board was applied, and a strain, developing in the solder bump, was analyzed. The analysis was effected while changing the size of the concentration void, and the relation between the size of the void and the strain was found.

The other model corresponds to uniform voids. In this analysis, the size of the uniform voids at the actual solder bump joint portion was measured, and from the average value of these measured values, it was decided that the size of the voids should be 1/30 of the diameter of the solder bump at the joint interface, and the relation between the number of the voids and a strain was found.

Figure 5:
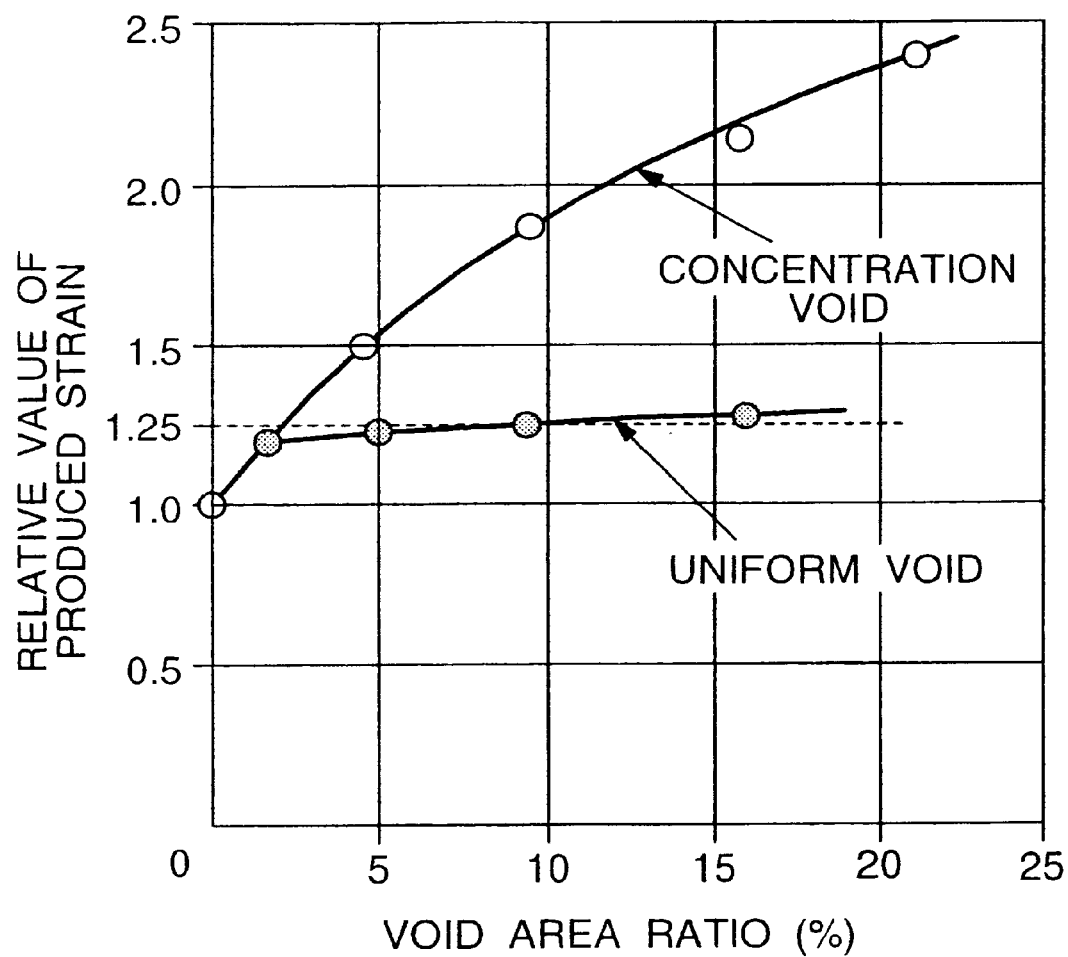
FIG. 5 is a graph showing the relation between voids and a strain developing in the solder bump.

FIG. 5 shows results of the analysis. The abscissa axis indicates the void area ratio, and represents the ratio of the sum of the void areas to the area of the joint interface. The ordinate axis indicates the strain developing in the solder bump, and represents a relative value of the strain (which indicates "1" when no void is present) in a dimensionless manner. For this graph, it will be appreciated that the larger the concentration void is, the larger the produced strain is. It is thought that the reason for this is that the large void invites the concentration of the strain. On the other hand, even if the total area of the uniform voids increases, that is, the number of the fine voids increases, the increase of the produced strain is very small. The reason for this is that the concentration of strain will not occur no matter how many fine voids there are present.

From the foregoing, it will be appreciated that in order to enhance the connection reliability of the solder joint portion of the BGA-type semiconductor device, it is effective to limit the size of the voids existing in the solder bump joint portion as described above.

Next, one preferred embodiment of the present invention will be described.

Figure 1:
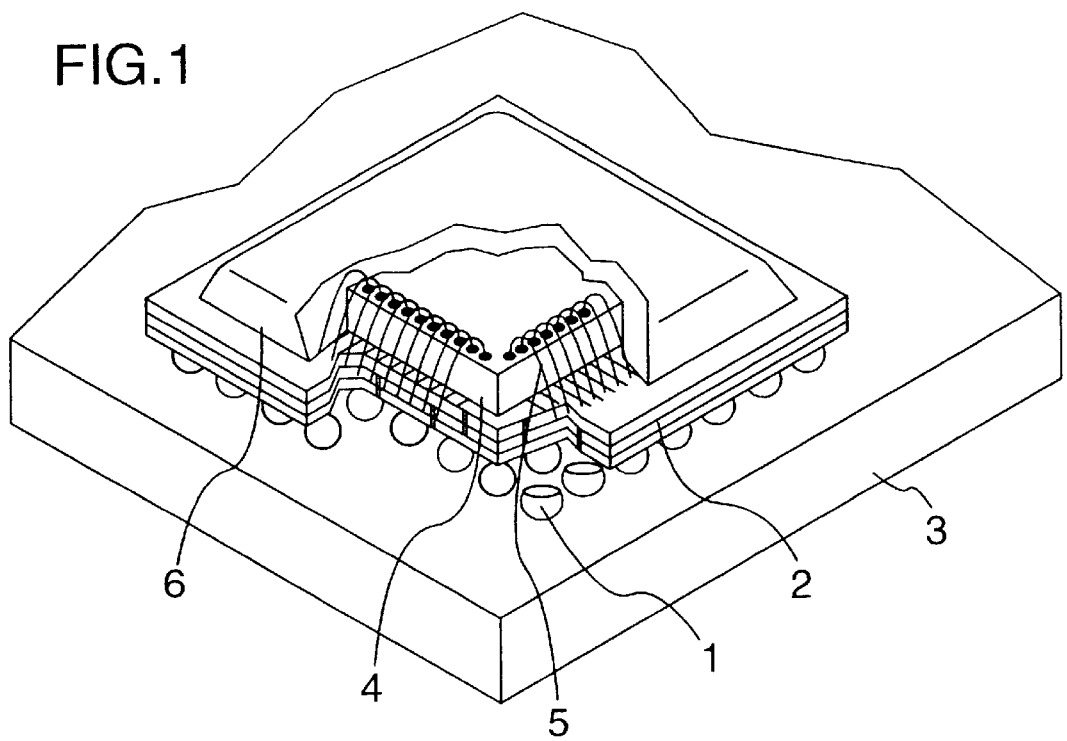
FIG. 1 is a perspective view of one preferred embodiment of BGA-type semiconductor device-mounting construction of the present invention.
Figure 2:
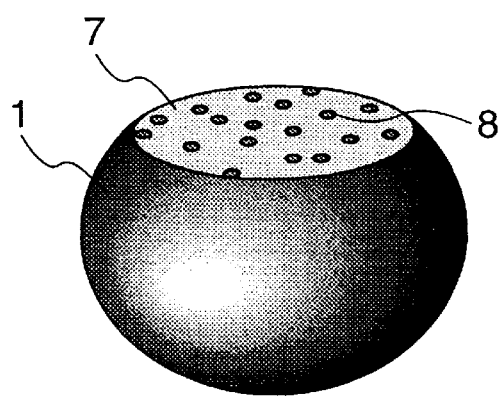
FIG. 2 is an enlarged, perspective view showing a joint interface of a solder bump used in the BGA-type semiconductor device-mounting construction.

FIG. 1 shows a BGA-type semiconductor device-mounting construction embodying the invention. In this Figure, part of the semiconductor device is removed in order to show the internal structure of the semiconductor device and the condition of solder joint portions. A semiconductor chip 4 is joined to a BGA board 2, and the two are electrically connected together by wires 5. The semiconductor chip 4 and part of the BGA board 2 are encapsulated by a resin 6. Solder bumps 1, serving as external terminals, are joined to a reverse surface of the BGA-type semiconductor device, and this BGA-type semiconductor device is mounted on a mounting board FIG. 2 shows the condition of a joint interface of the solder bump 1 of the BGA-type semiconductor device of FIG. 1 on an enlarged scale. Only uniform fine voids 8 are present in the joint interface 7 of the solder bump 1, and any concentration void, having a larger size, does not exist in the joint interface 7. Therefore, a strain, developing in the solder bump when the solder bump is subjected to thermal deformation, will not concentrate on one portion of the solder bump, and therefore the high connection reliability can be achieved.

The term "uniform voids" does not mean that these voids are exactly uniform or equal in size, but variations in void size are allowed. In an ordinary solder joint formed in the atmosphere, a variation of two times void size is inevitable. What is important here is to eliminate the concentration void having a large size, as described above in "SUMMARY OF THE INVENTION". Preferably, the size of each of the uniform voids is not more than 1/30 of the diameter of the solder bump at the joint interface.

The inventors of the present invention mounted the BGA-type semiconductor device on a printed circuit board in a conventional manner, and conducted a temperature cycling test. As a result, it was found that particularly those solder bumps, disposed closest to the outer periphery of the semiconductor device, w ere often subjected to a fatigue failure.

Therefore, the ruptured surfaces of the solder bumps, subjected to the fatigue failure, were observed, and as a result it was found that voids of a large size were present in these ruptured surfaces, and the minimum void size was 10% of the diameter of the joint interface, and the average void size was 12%, and the maximum void size was 20%.

For this, it has been found that if the diameter of the concentration void is not more than 10% of the diameter of the joint interface, the sufficient reliability can be obtained.

There are two methods for eliminating such a concentration void present in the solder joint surface. One is to decrease a heating rate for reflow soldering. When the heating is effected slowly, the components of the vapor of the flux are dissipated to the atmosphere before the solder is melted, and therefore will not be involved in the molten solder. The other method is to reduce the amount of the solder paste to an acceptable minimum. The inventors of the present invention succeeded in eliminating the concentration void by reducing the heating rate of the reflow soldering to ½ of that of the conventional reflow soldering and by reducing the amount of the solder paste to ⅔ of that of the solder paste used in the conventional soldering, and there existed no void whose diameter was more than 10% of the diameter of the joint interface.

Incidentally, a shearing strain Δγ, developing in a solder bump having no void, is expressed by the following equation:

$$\Delta\gamma = \Delta\alpha \times \Delta T \times L / h \qquad (1)$$

Where Δα represents the difference in the coefficient of linear expansion between a semiconductor device and a mounting board, ΔT represents a temperature change, L represents the distance between the center of the semiconductor device and the solder bump, and h represents the height of the solder bump which is 0.5 mm in the ordinary BGA-type semiconductor device. On the other hand, with respect to the reliability of the semiconductor device-mounting construction, generally, a 1,000-cycle fatigue life (that is, the number of applied repeated stress (or strain) cycles that the solder bump can ensure before failure is 1,000) is, in most cases, required relative to a temperature change of 200° C. The inventors of the present invention earlier conducted a solder fatigue strength test, and its results are described in Transactions of Japan Society of mechanical Engineers, Vol.54, No.505, p1709. According to these test results, the shearing strain for 1,000-cycle fatigue life is about 1.8%. As described above in "BACKGROUND OF THE INVENTION", Δα is about $2 \times 10^{-6}/°$ C. Therefore, when finding the value of L in the above equation, using $\Delta\alpha = 2 \times 10^{-6}/°$ C., $\Delta T = 200°$ C., h=0.5 mm and Δγ=0.018 (=1.8%), L=22.5 mm is obtained. Namely, the fatigue strength of the bump, spaced 22.5 mm from the center of the semiconductor device, can easily pass the ordinary reliability test if this bump has no defect.

In the present invention, however, the uniform voids are allowed to exist, and in this case, the value of the strain is 1.25 times larger than that obtained when no void is present, as can be seen from FIG. 5. Therefore, when finding the value of L, using the allowable strain represented by 0.018/1.25=0.0144, L=18.0 mm is obtained. If the BGA-type semiconductor device has a square shape, the solder bump with L=18.0 mm is disposed at a corner portion of the semiconductor device, and therefore the distance of the solder bump, disposed closest to the outer periphery of the semiconductor device, is $18.0/\sqrt{2} \times 2 = 25.4$ mm. The dimension of the semiconductor device must be larger than this distance, and therefore is about 30 mm. Namely, in a semiconductor device of a square shape whose one side is more than 30 mm, no margin is left for the fatigue strength of the ordinary reliability standard, and it is necessary that the present invention should be applied to such a semiconductor device. In the case of a semiconductor device of a rectangular shape whose longer sides are more than 30 mm, it is necessary that the present invention should be applied to it. According to the standard, the pitch of solder bumps in a BGA-type semiconductor device is 1.27 mm (1/20 inch), and therefore when the number of pins is calculated based on this condition, the pin number is 441 ((25.4 mm/1.27 mm+1)×(25.4 mm/1.27 mm+1)=21×21=441).

Finally, a method of inspecting or checking the semiconductor device-mounting construction of the invention will be described. For inspecting a joint reliability of a solder joint portion, an evaluation has heretofore been made based on the ratio of the total area of voids at a joint interface. However, as shown in FIG. 5, it has become clear in the process of making the present invention that a strain, developing in the solder, is determined by the size of a concentration void rather than by the ratio of the void area, as shown in FIG. 5. Therefore, for inspecting the semiconductor device-mounting construction of the invention, it is only necessary to inspect the largest void at the interface between the solder bump and the semiconductor device. Namely, a sampling destructive test or a fluoroscopic test is effected, and when the value of the largest void exceeds a predetermined value, the semiconductor device-mounting construction is decided as a rejected one.

In the present invention, there is achieved an advantage that in the BGA-type semiconductor device-mounting construction, the connection reliability of the solder bumps, used as the external terminals, is enhanced,

What is claimed is:

1. A semiconductor device-mounting construction comprising:
    a semiconductor device having a plurality of electrodes formed on one main surface thereof;
    a printed circuit board having a wriring pattern formed on one main surface thereof; and
    a plurality of solder bumps interposed between said plurality of electrodes and said wriring pattern to electrically connect said semiconductor device and said printed circuit board together;
    wherein all of voids, which are present in an interface of each of those of said plurality of solder bumps which are disposed closest to an outer peripheral edge of said semiconductor device, joined to said semiconductor device, are fine, and generally uniform in size; and
    wherein a length of one side of said semiconductor device is not less than 30 mm.

2. A mounting construction according to claim 1, in which the number of said electrodes of said semiconductor device is not less than 441.

3. A semiconductor device-comprise construction comprising:
    a semiconductor device having a plurality of electrodes formed on one main surface thereof;
    a printed circuit board having a wiring pattern formed on one main surface thereof; and
    a plurality of solder bumps interposed between said plurality of electrodes and said wiring pattern to electrically connect said semiconductor device and said printed circuit board together;
    wherein all of voids, which are present in an interface of each of those of said plurality of solder bumps which are disposed closest to an outer peripheral edge of said semiconductor device, joined to said semiconductor device, are fine, and generally uniform in size; and
    wherein the number of said electrodes of said semiconductor device is not less than 441.

4. A semiconductor device-mounting construction comprising:
    a semiconductor device having a plurality of electrodes formed on one main surface thereof;
    a printed circuit board having a wiring pattern formed on one main surface thereof; and
    a plurality of solder bumps interposed between said plurality of electrodes and said wiring pattern to electrically connect said semiconductor device and said printed circuit board together;
    wherein a diameter of all of voids, which are present in an interface of each of those of said plurality of solder bumps which are disposed closest to an outer peripheral edge of said semiconductor device, joined to said semiconductor device, is not more than 1/10 of a diameter of said interface.

5. A mounting construction according to claim 4, in which a length of one side of said semiconductor device is not less than 30 mm.

6. A mounting construction according to claim 4, in which the number of said electrodes of said semiconductor device is not less than 441.

7. A method of inspecting a connection reliability of solder bumps in a semiconductor device-mounting construction comprising a semiconductor device having a plurality of electrodes formed on one main surface thereof, a printed circuit board having a wiring pattern formed on one main surface thereof, and a plurality of solder bumps interposed between said plurality of electrodes and said wiring pattern to electrically connect said semiconductor device and said printed circuit board together, comprising the steps of:

determining whether a diameter of the largest one of voids, which are present in an interface of each of said solder bumps joined to said semiconductor device, exceeds a predetermined value and rejecting said semiconductor device-mounting construction when the diameter of the largest one of the voids is determined to exceed the predetermined value.

8. A method according to claim 7, in which said predetermined value is not more than $1/10$ of the diameter of said interface.

* * * * *